(12) United States Patent
Bedard

(10) Patent No.: US 7,459,927 B2
(45) Date of Patent: *Dec. 2, 2008

(54) SUPERCONDUCTIVE CROSSBAR SWITCH

(76) Inventor: Fernand D. Bedard, 505 Hermleigh Rd., Silver Spring, MD (US) 20902

( * ) Notice: Subject to any disclaimer, the term of this patent is extended or adjusted under 35 U.S.C. 154(b) by 0 days.

This patent is subject to a terminal disclaimer.

(21) Appl. No.: 11/209,662

(22) Filed: Aug. 24, 2005

(65) Prior Publication Data

US 2007/0236245 A1 Oct. 11, 2007

Related U.S. Application Data

(63) Continuation of application No. 10/200,115, filed on Jul. 23, 2002, now Pat. No. 6,960,929.

(60) Provisional application No. 60/306,880, filed on Jul. 23, 2001.

(51) Int. Cl.
*H03K 17/92* (2006.01)

(52) U.S. Cl. ............ 326/1; 326/2; 326/3; 327/527; 327/366; 327/528; 365/160; 365/162

(58) Field of Classification Search ............ 326/1–7; 327/527, 366, 528; 365/160–162
See application file for complete search history.

(56) References Cited

U.S. PATENT DOCUMENTS

| | | | |
|---|---|---|---|
| 3,539,730 A | 11/1970 | Imamura | |
| 4,210,921 A | 7/1980 | Faris | |
| 5,247,475 A | 9/1993 | Hasunuma et al. | |
| 5,388,068 A * | 2/1995 | Ghoshal et al. | 365/162 |
| 5,434,530 A * | 7/1995 | Ghoshal et al. | 327/527 |
| 5,629,889 A | 5/1997 | Chandra et al. | |
| 6,154,044 A | 11/2000 | Herr | |
| 6,229,332 B1 * | 5/2001 | Herr | 326/1 |
| 6,242,939 B1 | 6/2001 | Nagasawa et al. | |

OTHER PUBLICATIONS

International Search Report for PCT/US02/23249 issued Jan. 24, 2003.
Office Action for U.S. Appl. No. 10/200,115, mailed Feb. 3, 2005.

* cited by examiner

*Primary Examiner*—Vibol Tan
(74) *Attorney, Agent, or Firm*—DLA Piper LLP US

(57) ABSTRACT

A superconductor crossbar switch for connecting a plurality of inputs with a plurality of outputs, including a switching cell having an input, an output and a circuit for connecting the input with the output for bidirectionally transmitting data therebetween. The connection of the retaining and releasing circuitry of a plurality of cells enables the switch to simultaneously retain a selected cell or cells of a group of cells and disable the remaining cells of that group, whereby a subsequent query on a disabled cell is inoperative until the selected cell or cells is released. The crossbar switch is characterized by latency on the order of nanoseconds, a data rate per channel on the order of gigabits per second, essentially zero crosstalk, and detection of contention in nanoseconds or less and resolution of contention in nanoseconds or less.

1 Claim, 17 Drawing Sheets

SUPERCONDUCTIVE CROSSBAR SWITCH

CROSS-REFERENCE TO RELATED APPLICATIONS

This application is a continuation of U.S. application Ser. No. 10/200,115, filed on Jul. 23, 2002 now U.S. Pat No. 6,960,929, which, in turn, is based on and derives the benefit of U.S. Provisional Patent Application Ser. No. 60/306,880, filed on Jul. 23, 2001. The entire contents of Ser. No. 10/200,115 and Ser. No. 60/306,880 are incorporated herein by reference.

This invention was made with government support of Job No. 768, of the National Security Agency. The government may have certain rights in this invention.

BACKGROUND OF THE INVENTION

Field of the Invention

The present invention relates to superconductive switching devices, and in particular to a superconducting crossbar switch for bi-directionally connecting a plurality of inputs with a plurality of outputs.

Background of the Technology

Advances in high performance computing are being pursued in many different directions. The technology thrust has been directed toward very high speed, high circuit density chips which are of low power (to permit small volume packaging) and organized into a small number of processors. Another thrust involves the use of many processors, tens to perhaps thousands, working in concert to perform the computation. In this case, the stress on the individual elements is relieved and there is greater computational power, but interconnection problems that arise with the added software complexity must be solved.

One of the configurations for a massively parallel computing system calls for a large number of processors to be connected to a large shared memory system on an equal access basis. The demands placed upon the interconnection switch are formidable, in terms of complexity, speed, and intelligence. For example, the switch must have a short latency time and must establish the requested connection very quickly, ideally within a small fraction of the processor clock time. The data rate per channel must also be very high. For example, for a 32 bit word machine with a 30 nanosecond clock, a data rate of $10^9$ bits/second (i.e., gigabits/second) per processor is required. Once established, the data path must be immune to noise, and crosstalk must be kept to a minimum. The established link must be inviolate during the processor transaction time and releasable very quickly, ideally within a clock cycle.

There is a need to inform the processor of successful connection. The time during which two or more processors contend for the same memory port needs to be minimized with fast resolution of these contentions. Finally, data needs to be transferred in both directions. Although there are a number of switch architecture solutions, it is generally accepted that the best solution is a crossbar, which is a switch that allows the requesters equal access at the same level to any output line.

Computer systems also need high bandwidth and short access times to carry out data exchange between memory and processors, and among processors.

Related Art

Crossbar switches are well-known in the prior art, as evidenced by U.S. Pat. No. 3,539,730 to Imamura, which discloses a crossbar switch used in a two-stage link connection system. Each switch is divided into two parts, in accordance with vertical groups. The parts of the switch are assigned to primary and secondary lattices, respectively, with links between the lattices being formed by connecting the outgoing lines from the primary lattice of one switch with the secondary lattice of another switch.

Also known in the art are polarity switching circuits which utilize Josephson junction devices (e.g., interferometers) and superconducting interconnections coupled to a utilization circuit, including one or more memory cells or logic circuits. Such circuits are disclosed, for example, in U.S. Pat. No. 4,210,921 to Faris.

Prior switching circuits possess certain inherent drawbacks that render them unsuitable for use with large numbers of computing elements. As a result, they cannot meet all of the requirements set forth above for a massively parallel computing system.

SUMMARY OF THE INVENTION

The present invention overcomes the above identified drawbacks of the prior switching circuits, as well as others, by providing a modular crossbar switch that is extendable in size, operates under low power with low latency, and detects and resolves conflicts that arise when two or more processors contend for the same memory port. The switch of the present invention is capable of interconnecting N computers or processors with M memories, or other processors or computers where N and M can be of the order of 1000 or more. One embodiment of the present invention is also modular, in that small crossbars can easily be extended to become very large ones, (e.g., 32×32 can grow into 1000×1000). In addition, if the computer data rate exceeds that of one channel, paralleling of channels is easily performed. The switch is also suitable for general communications network usage, as well.

An embodiment of the present invention includes a crossbar switch for connecting a plurality of input devices with a plurality of output devices, and a switching cell having an input, an output, and an apparatus for connecting the output for bi-directionally transmitting data there between. The connecting apparatus includes a superconductive device having zero resistance and negligible crosstalk, and a control device to control operation of the connecting apparatus. The connecting apparatus provides a connection for a plurality of processors or functional units to be connected to one another. For example, a configuration of adders, multipliers, and dividers can be switched, such that data can be routed sequentially from one function to another with arbitrary freedom.

Another embodiment of the present invention includes a second superconductive device and a second control device to retain and release the operation of the first superconductive device.

An additional embodiment of the present invention includes a plurality of inputs, a plurality of outputs, and a plurality of cells arranged in a matrix, with the inputs coupled to one plurality of cells and the outputs connected to another plurality of cells, so as to define a superconducting device matrix. In an embodiment of the present invention, the cells are connected in parallel with the inputs and outputs.

In a further embodiment of the present invention, each output includes a summing device for summing output voltages or currents of the cells connected therewith, in order to accommodate the inputs and to render the matrix extendable in numbers of inputs and outputs.

The summing device may include a summing amplifier or an additional superconductive device.

In another embodiment of the present invention, the switching cells include a feedback mechanism connected to the outputs which feeds data to the outputs and acknowledges pulses back to a requester.

In yet another embodiment of the present invention, retaining and releasing devices for the cells are connected to the outputs and are interconnected and operable to simultaneously retain a selected cell of the plurality of cells, and disable the remaining cells of the plurality of cells, whereby a subsequent query on a disabled cell is inoperative until the selected cell is released. The crossbar also allows multicast or broadcast operation wherein any one input may be connected simultaneously or in arbitrary order to more than one or all of the output ports.

In a further embodiment of the invention, a sensing apparatus is connected with each of the outputs for detecting simultaneous queries to cells of the respective groups of cells and for generating to the processors via the cells an indication of conflict from the simultaneous queries as well as resolving these conflicts while preventing further interference.

Additional advantages and novel features of the invention will be set forth in part in the description that follows, and in part will become more apparent to those skilled in the art upon examination of the following or upon learning by practice of the invention.

DETAILED DESCRIPTION OF THE INVENTION

Figure 1:
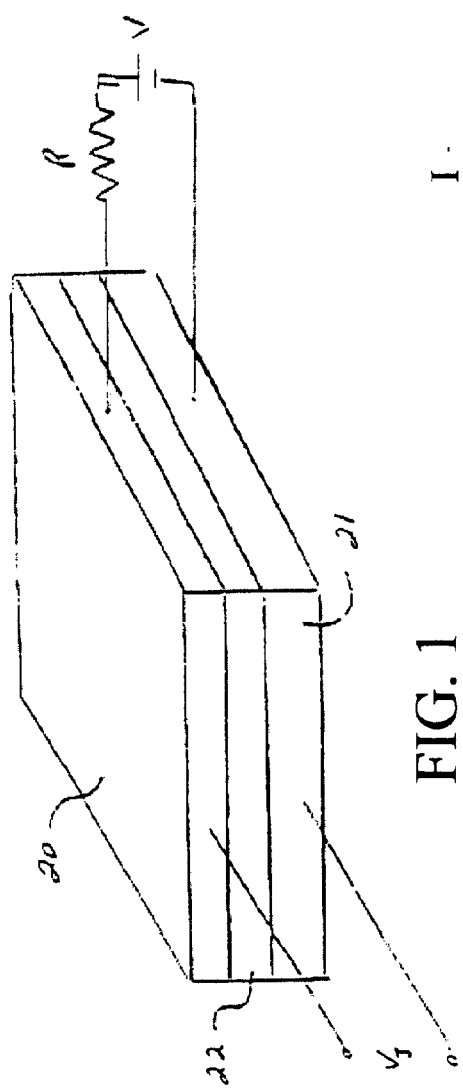
FIG. 1 illustrates a prior art Josephson junction device.

FIG. 1 illustrates a Josephson tunnel junction device known in the prior art. The Josephson tunnel junction device includes top and bottom layers 20, 21 of superconductor material sandwiching a thin insulating film 22. If a voltage V is applied between the top and bottom layers through a resistance R, there is a range of current in which zero resistance current up to $I_m$, can be transported between the two elements.

Figure 2:
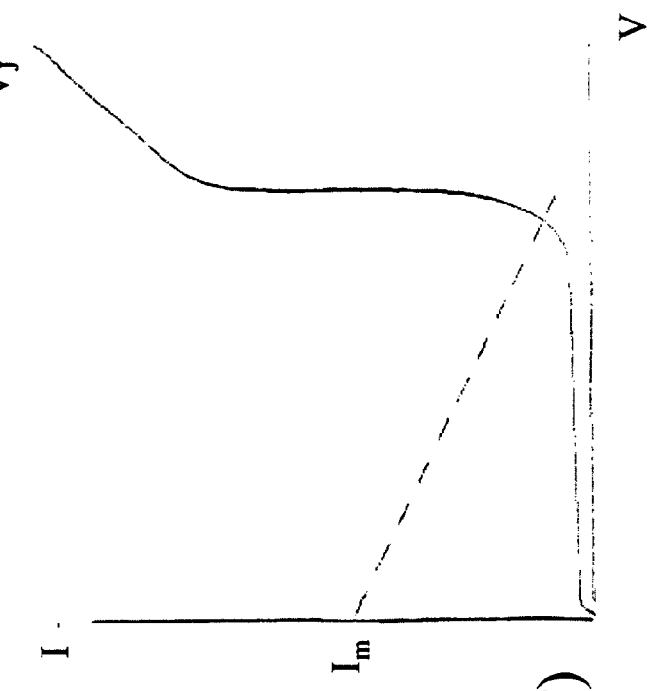
FIG. 2 is a graph illustrating the operation of the Josephson junction device of FIG. 1.

FIG. 2 illustrates the behavior of the circuit current I as the input voltage V is increased for a representative resistance R, in the Josephson tunnel junction device shown in FIG. 1. The voltage $V_j$ across the device will be zero until the device current exceeds $I_m$, at which point the junction will switch to the voltage state consistent with the circuit load resistor R and the device's own voltage-current curve J, determined by the physics and manufacturing art.

Figure 3:
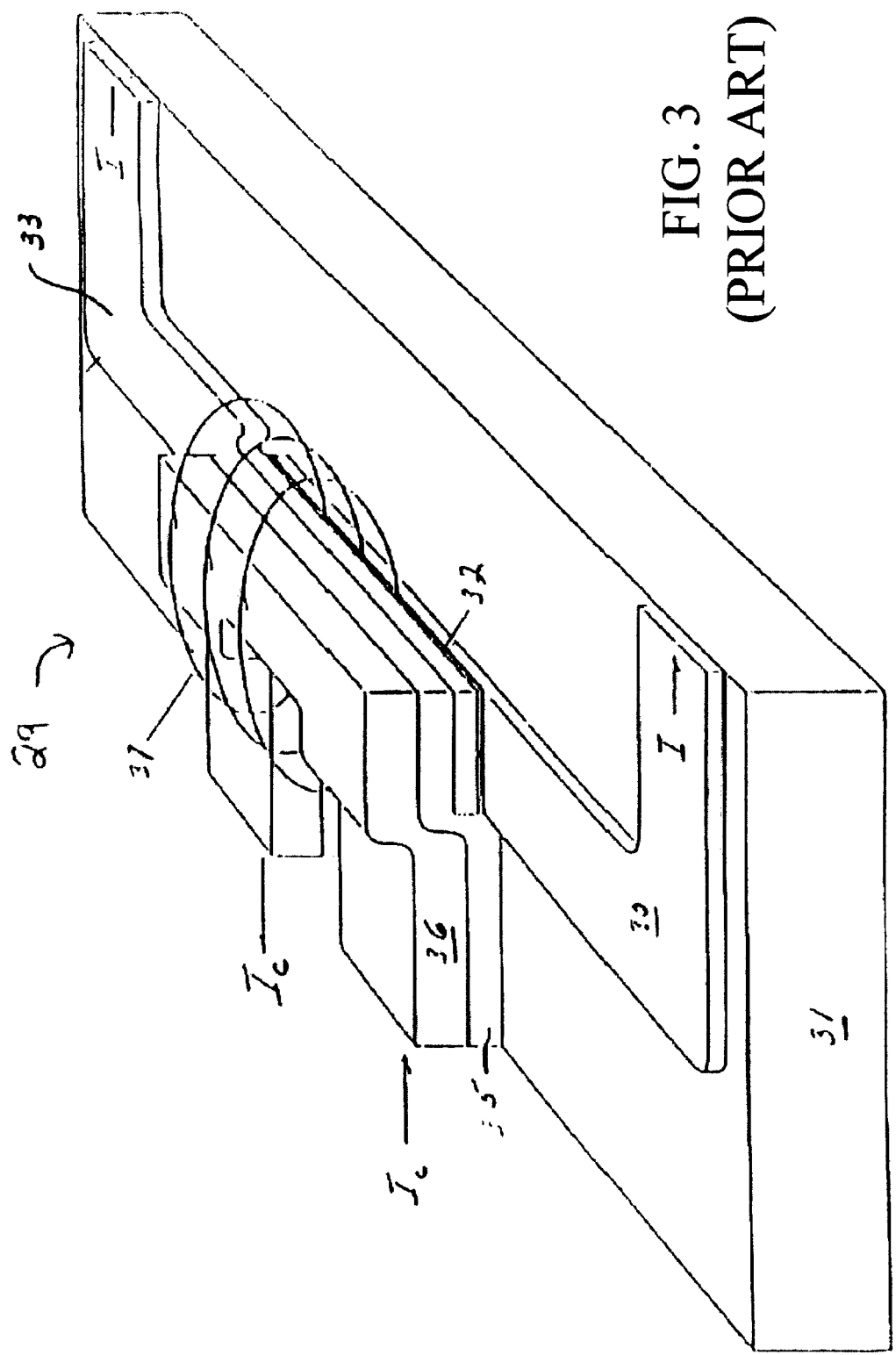
FIG. 3 is a simplified perspective view of a prior art Josephson junction device with a magnetic field control line.

FIG. 3 illustrates a Josephson junction device 29 known in the prior art, in which switching occurs by imposing a magnetic field into a junction via a control line placed above it. The current I to be controlled is carried through a first layer of superconducting material 30 on a substrate 31. A thin film of insulator 32 separates the first superconducting material 30 from a second layer of superconducting material 33. An insulator layer 35 separates layer 33 from a third layer of superconducting material 36. When a control current $I_c$, passes through layer 36, a magnetic field 37 is created at the junction, which reduces the maximum allowed zero resistance current. Thus, if the device's transport current I is greater than the new allowed value, the device will switch into the voltage state, similar to as described above with regard to FIGS. 1 and 2. The device can be fabricated to switch with picosecond rise times, with its final voltage state in the millivolts range for presently available materials. The currents that are switched are most often in the hundreds of microamperes range. The power dissipation per unit is in the microwatt range.

Figure 4:
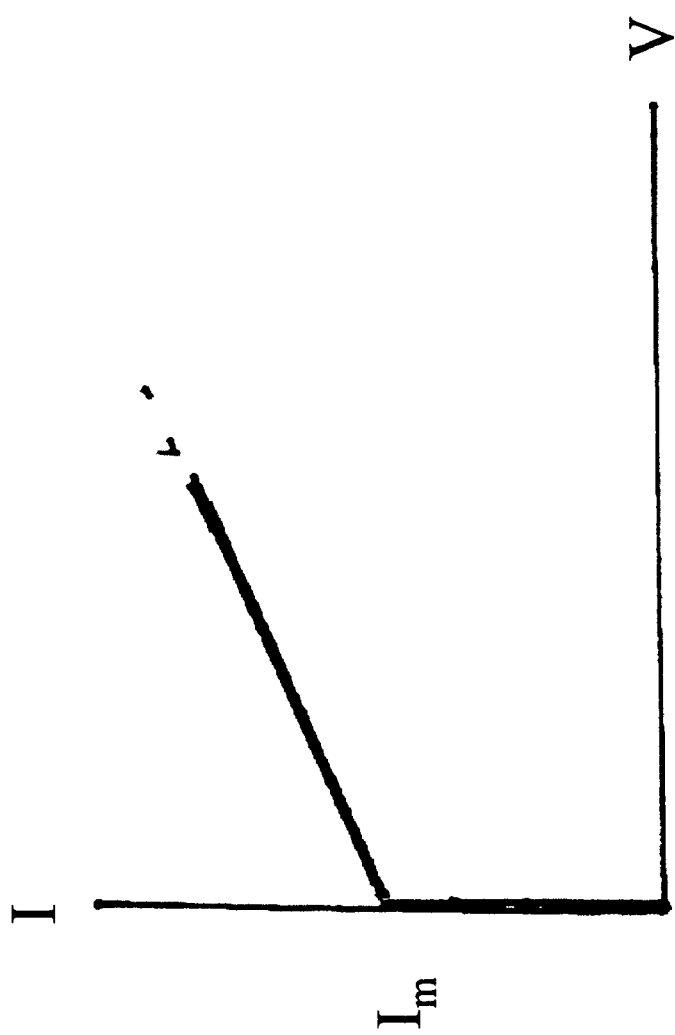
FIG. 4 shows prior art operation of Josephson junctions in which a resistor is placed between the electrode and the counter-electrode for the device shown in FIG. 1.

The prior art also includes fabrication of Josephson Junctions in which the device has the current versus voltage curve represented by FIG. 4, as compared with FIG. 2. This behavior may be acquired by a resistor being placed between the electrode and the counter-electrode of the device in FIG. 1. Or, equivalently, one may achieve such a "weak link" behavior by fabricating the Josephson device with a conductor between the two electrodes of FIG. 1. It is also well known that such behavior is a standard property of so-called "high temperature" superconductive Josephson Junctions. The effect of such a device is to provide a voltage, when switched, which is dependent upon the resistors in the circuit. Nevertheless, the circuits required can still be made from such junctions.

Figure 6:
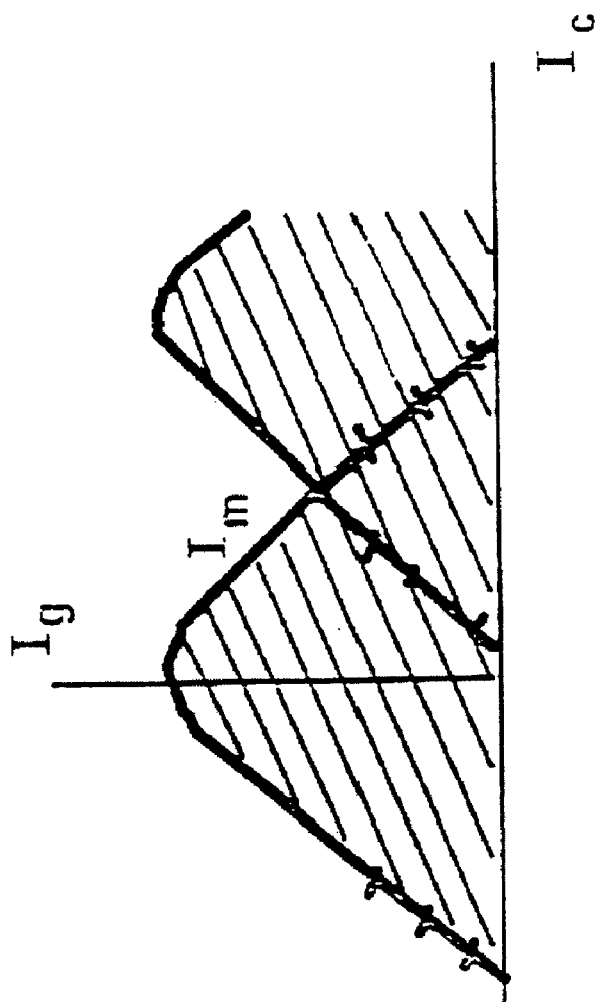
FIG. 6 is a graph representing the operation of the SQUID device of FIG. 5.
Figure 5:
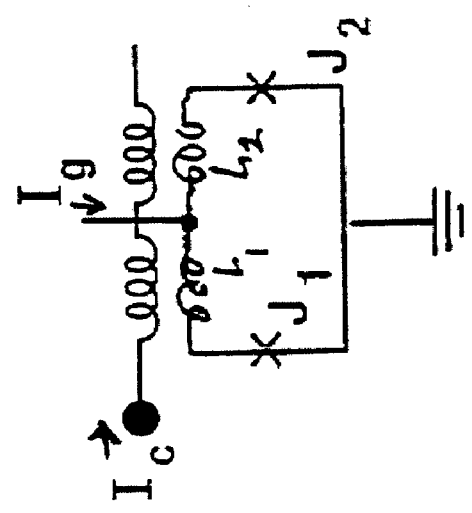
FIG. 5 is a schematic representation of a prior art Superconducting Quantum Interference Device (SQUID) device.

If one connects a Josephson junction in parallel with an inductance, the closed loop forms a Superconducting Quantum Interference Device (SQUID), which is also known in the prior art. Insertion of a second junction into this loop, as illustrated in FIG. 5, also produces a SQUID, but with device properties that are very advantageous in switching applications. In particular, if an input current $I_g$ is inserted and divided between the two junctions, $J_1$ and $J_2$, that zero resistance transport current can be controlled by introducing magnetic flux into the closed loop via the control current, $I_c$. FIG. 6 shows the curve of allowed zero resistance current, $I_g$, as a function of the imposed control current, $I_c$. $I_m$ represents the maximum gate current $I_g$ as a function of the control current $I_c$. In particular, if an input current $I_g$ is inserted, it will be divided into two paths according to the size of the inductors $L_1$, and $L_2$ and the maximum critical currents of $J_1$ and $J_2$, as well as by the control line current $I_c$, which is magnetically coupled to the loop. FIG. 6 represents the joint values of $I_g$ and $I_c$, for which current $I_g$ can be transported through the loop with zero resistance. This region is represented by the shaded area. Joint values of $I_g$ and $I_c$, which are above this area, will result in non-zero voltage transport of $I_g$. A control line can thus be used to change the maximum zero resistance current of a two terminal Josephson junction, or SQUID. The detailed properties depend upon the inductance, critical currents of the device, and insertion point(s) of the currents. (A more detailed explanation of the structure and operation of the Josephson junction and the SQUID is found in the IBM Journal of Research and Development, vol. 24, No. 2 (March 1980), which is hereby incorporated by reference.)

Superconductive Crossbar Switch

Figure 7:
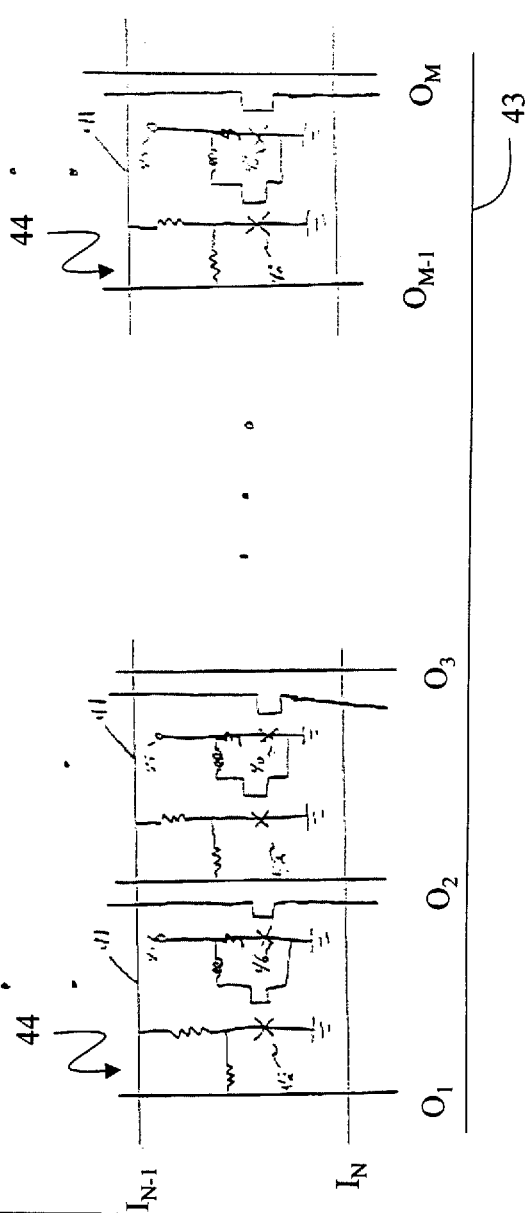
FIG. 7 illustrates a matrix of cells comprising a superconductive crossbar switch, in accordance with an embodiment of the present invention.

FIG. 7 illustrates a superconductive crossbar switch, in accordance with an embodiment of the present invention. The superconductive crossbar switch 39 includes at least one cell 41 in a matrix, which are arranged in rows and columns in accordance with the number of input lines $I_i$ 40 and output lines $O_i$ 43. For example, there are N inputs and M outputs for coupling, such as via or including wired, wireless, or fiberoptic connections, N processors with M memories. The number of inputs and outputs need not be equal. In one embodiment of the present invention, the superconductive crossbar switch 39 is extendable to accommodate large numbers of processors and memories. Thus, for example, the module can easily be extended from a 32 input×32 output to a 1024 input×1024 output configuration, as is further described below.

Each input port connects to a row of cells 41 via an input line $I_i$ 40. Each cell 41 includes a connecting circuit 44, which connects the input line $I_i$ to a selected output line $O_i$ for bidirectionally transmitting data therebetween. The connecting circuit includes a first superconductive device 42, which has zero-resistance. A first control signal applied to a first terminal 45 controls the first superconductive device 42 externally on command, for controlling operation of the superconductive crossbar switch 39. In one embodiment, the first control signal comprises an electrical current.

Each cell 41 also includes a retaining and releasing circuit for retaining (i.e., clamping) and releasing the operation of the first superconductive device 42. The retaining and releasing circuit includes a second superconductive device 46 and a second control signal, delivered through a clamp line 49 at a second terminal 47, for controlling the second superconductive device 46 and the devices 46 of the cells 41 in the same column of cells 41, as shown in FIG. 7.

The first and second superconductive devices 42 and 46 can also be addressed by optical illumination, in another embodiment of the present invention. For example, if the first superconductive device 42 is optically illuminated, the switch cell connection from input to output will be maintained for the duration of the optical signal. In effect, the optical beam has "enabled" the desired connection. If the second superconductive device 46 is addressed by the optical beam, the current will be steered into the control line for the first superconductive device 42. Alternatively, an electron beam could be used instead of an optical beam.

When the cells 41 are arranged in a matrix as shown in FIG. 7, each input line $I_i$ 40 is coupled to a cell 41 (e.g., a row of cells), thereby to define a matrix of cells.

Method of Using the Superconductive Crossbar Switch

Figure 8:
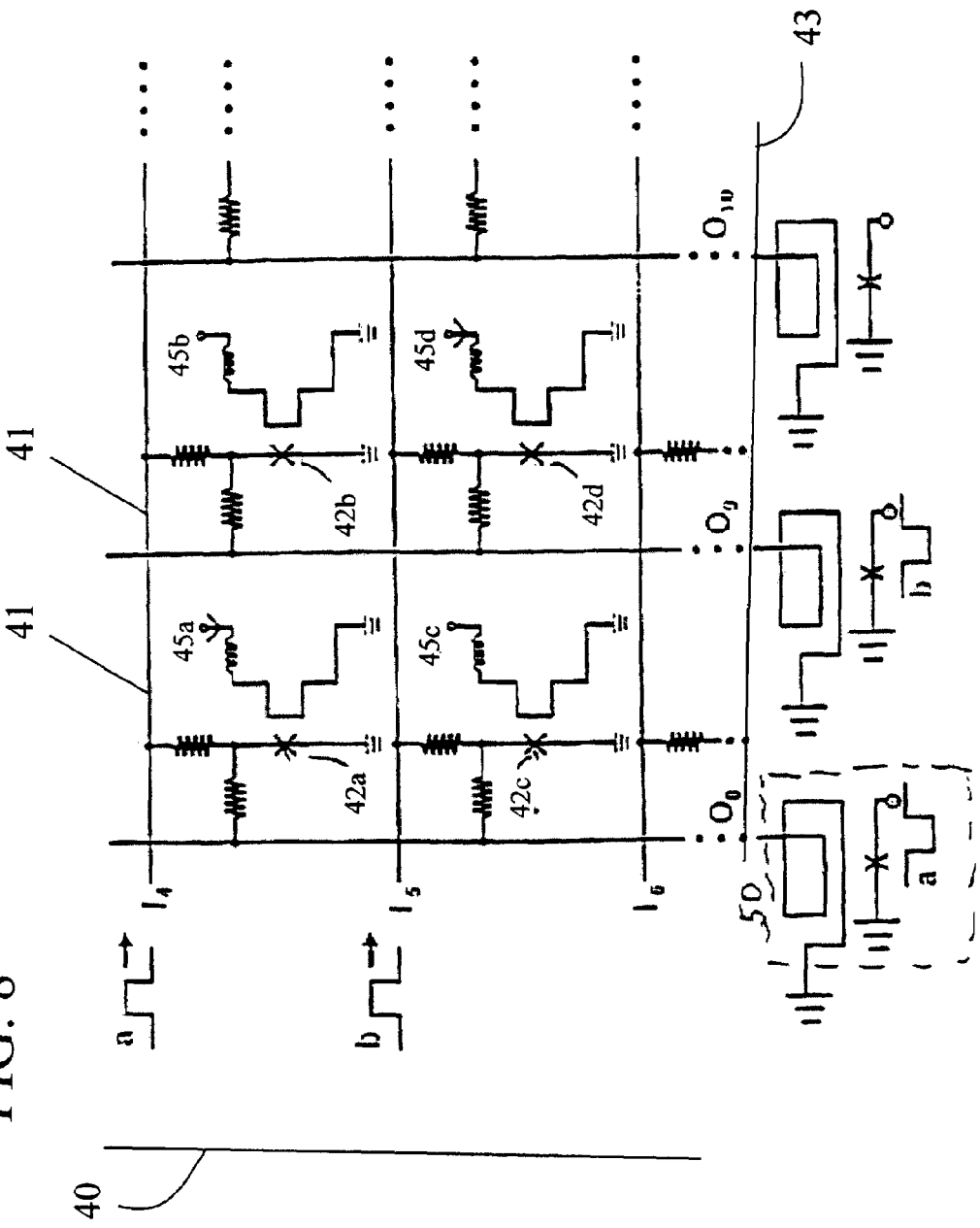
FIGS. 8 and 9 illustrate use of the superconductive crossbar switch, in accordance with an embodiment of the present invention.
Figure 9:
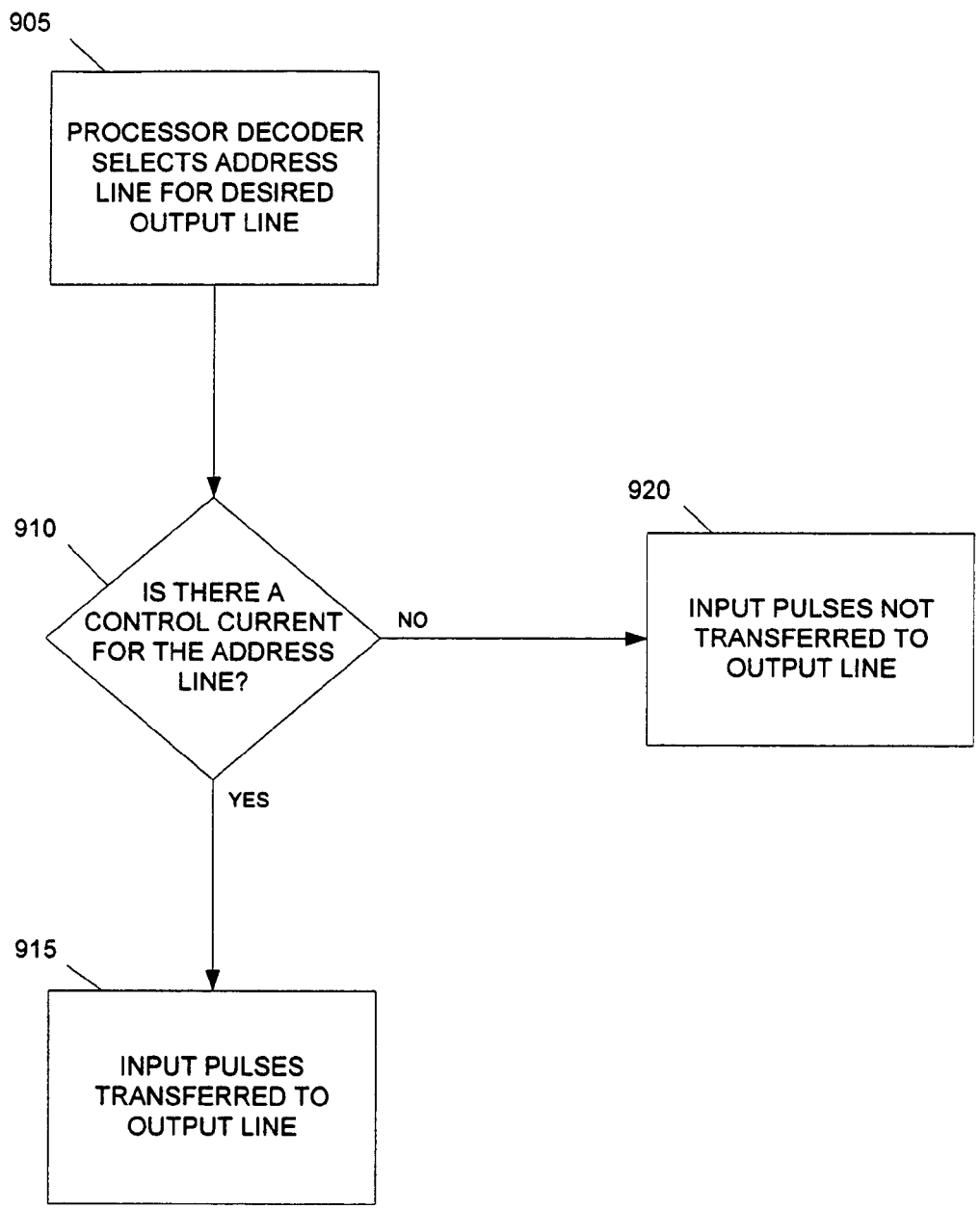

FIGS. 8 and 9 illustrate use of the superconductive crossbar switch 39, in accordance with an embodiment of the present invention. Referring to FIG. 8, the processors and memories coupled to the input lines 40 ($I_i=I_4, I_5, I_6$) and output lines 43 ($O_i=O_8, O_9, O_{10}$), respectively, need not be synchronously clocked, but instead may be run independently. The operation will be described for the example of a 32 input×32 output crossbar chip organized as shown in FIG. 8, but it should be understood that any number of inputs 40 and outputs 43 may be provided. In this example, each of the 32 input lines from the 32 processors transmits a serial bit stream. The first serial bit word, or part of it, from a processor (or other source), contains the address of the specific memory line which the processor is attempting to acquire. In addition, the address bits are followed by a "FLAG" bit, a "one." This first word carrying the destination address and the FLAG bit is input to the requesting processor's data line. The decoder selects the appropriate $1^{st}$ control line (45a) and powers it, thereby permitting the FLAG bit to proceed to the output line.

The initial state of each cell is a zero current condition in the first address terminals 45a, 45b, 45c, and 45d, corresponding to the first terminal 45 in FIG. 7. As there is no current in the address lines, all the devices 42a, 42b, 42c, and 42d will short the processor pulses on input lines 40 to ground and therefore no output is observed at output lines 43.

If now the processor coupled to input line I4 attempts to access the memory coupled to output line $O_8$, the process of FIG. 9 is followed. The processor decoder selects the address line for the output line $O_8$, contained in the processor's request word (step 905 of FIG. 9). After the address line is found (decoded), it is determined if there is a control current for the address line (step 910 of FIG. 9).

If there is a control current (step 910 of FIG. 9), a decoder current is impressed at terminal 45a, which depresses the zero resistance current threshold of superconductive device 42a, thereby allowing input pulses to be transferred across the superconductive device 42a (step 915 of FIG. 9). Subsequent pulses from the processor or input line 14 are then fed into the output line $O_8$, and thus, for example, into a summing circuit 50.

If there is no control current for the address line (step 910 of FIG. 9), the input pulses on input line $I_5$ are not transferred to output line $O_8$ (step 920 of FIG. 9), but are shorted to ground by the superconductive device 42b, as shown in FIG. 8. Thus, the input pulses from another processor do not interfere with the data pulses from input line 14 on output line $O_8$.

Correspondingly, if, for example, input line $I_5$ seeks to send data to output line $O_9$, then a current is impressed at terminal 45d by the processor decoder and the input data pulse stream is then imposed upon output line $O_9$, with no interference from the processor coupled to input line 14 because its control line 45b is not driven.

Superconductive Crossbar Switch Coupled to Summing Device

Figure 10:
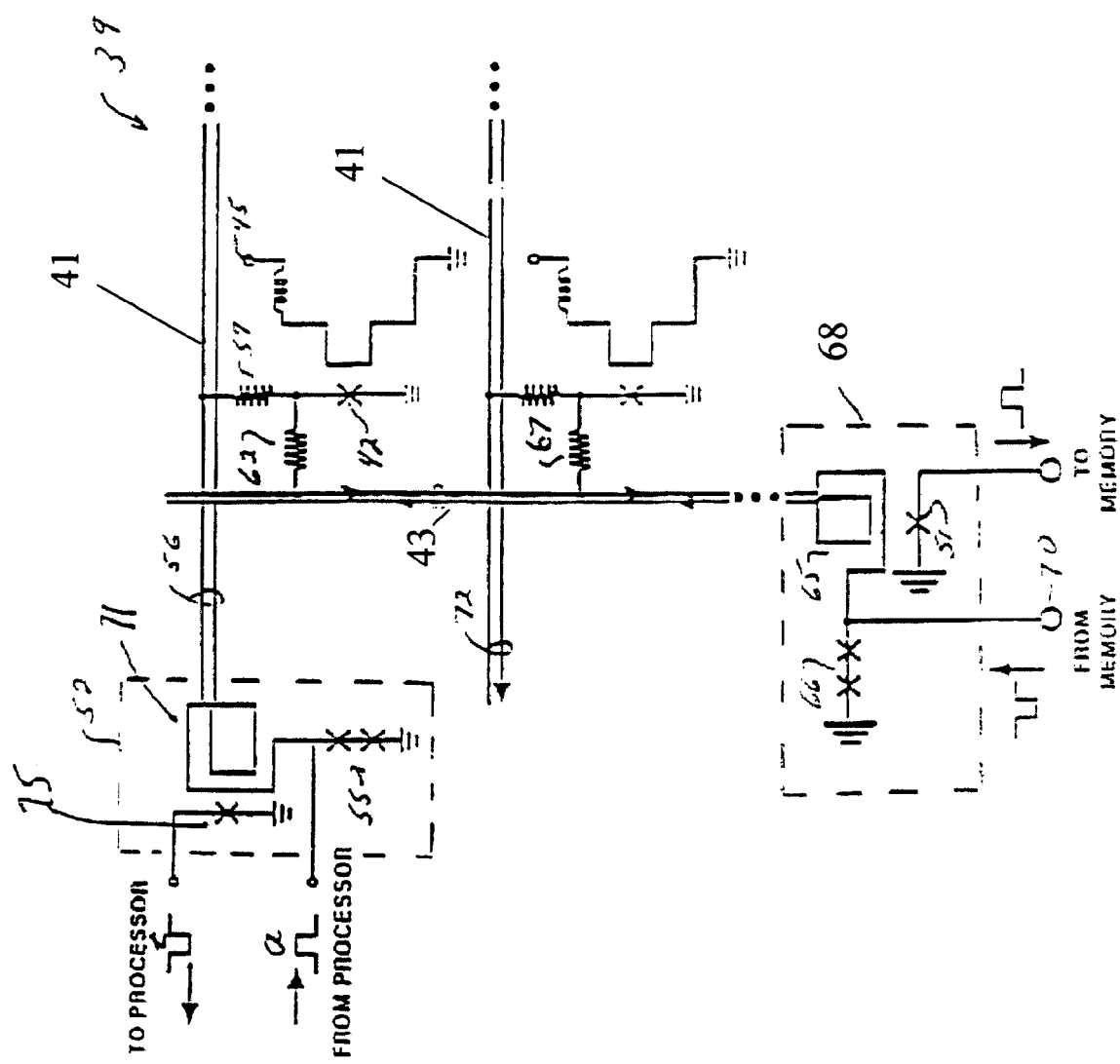
FIGS. 10 and 11 illustrate use of the superconductive crossbar switch, connected to a summing device, in accordance with an embodiment of the present invention.
Figure 11:
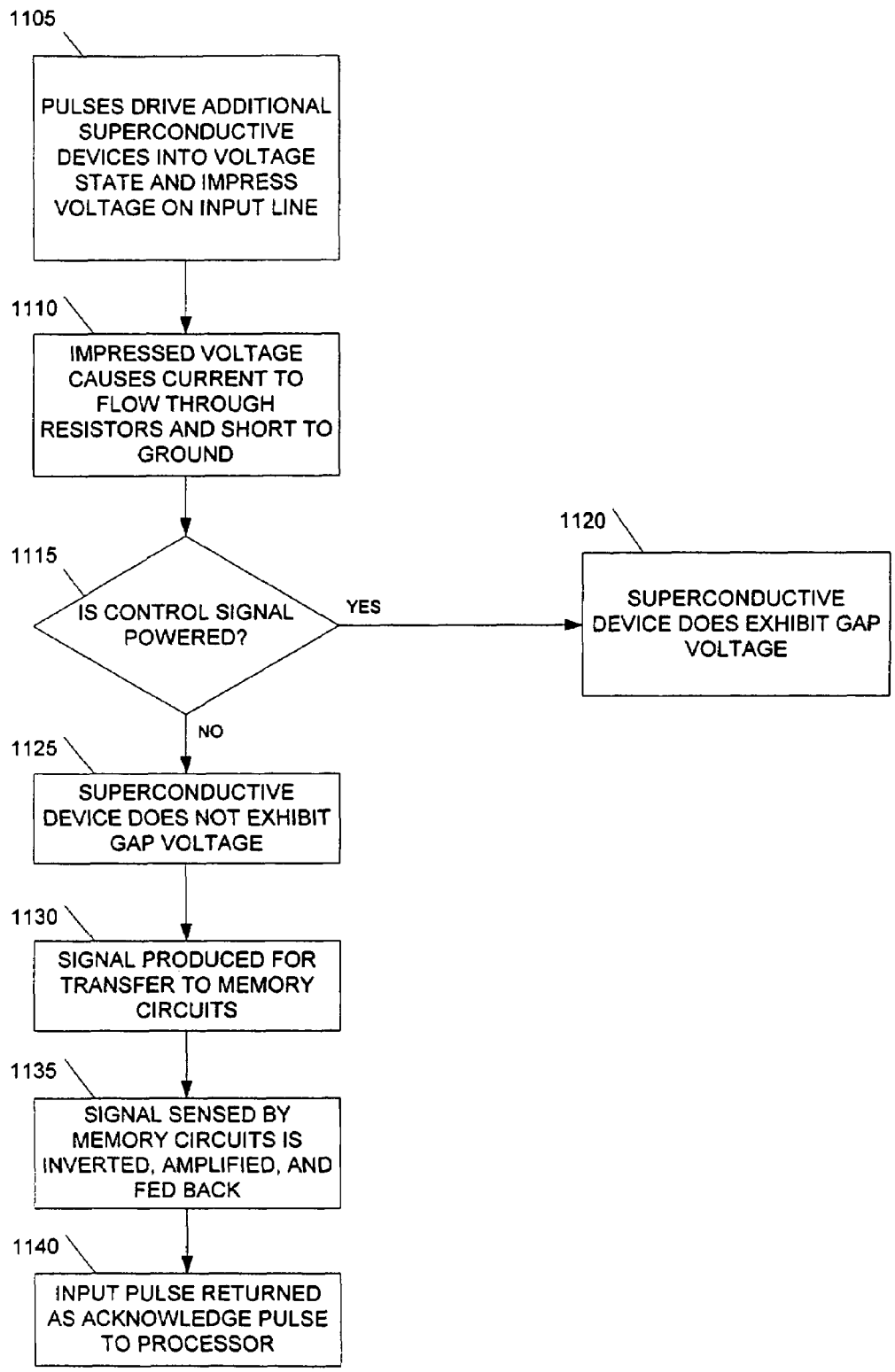

FIGS. 10 and 11 illustrate use of an example superconductive crossbar switch 39 coupled to a summing device 68, in accordance with an embodiment of the present invention.

Referring to FIG. 10, each cell 41 is similar to the cells 41 shown in FIG. 8. In addition, each output line 43 is coupled to a summing device 68 containing a third superconductive device 51 controlled by the control line 65. An input driver circuit 52 couples each input line to its corresponding processor.

FIG. 11 illustrates an exemplary process for using the superconductive crossbar switch 39, coupled to a summing device 68, as shown in FIG. 10. In FIG. 10, pulses a from the processor drive additional superconductive devices 55 into the voltage state and thereby impress a voltage on the input line 40 (step 1105 of FIG. 11), which is coupled to all the row cells accessed by that processor. The impressed voltage causes a current to flow through the resistor 57 to be shorted to ground via the first superconductive device 42 (step 1110 of FIG. 1).

It is determined if the control signal provided at terminal 45 is powered (step 1115 of FIG. 11). If yes, that control signal can be made sufficient to reduce the critical current through first superconductive device 42, such that it exhibits a "gap" voltage (step 1120 of FIG. 11). The pulse current passing through the first superconductive device 42 will exceed the maximum zero resistance current and the first superconductive device 42 will switch into the voltage state, thereby impressing its "gap" voltage upon the cell tie point between resistors 57 and 62.

If the control signal is not powered (step 1115 of FIG. 11), the superconductive device 42 may be operated such that it transfers to a resistive state, or the superconductive device 42 itself may be fabricated such that it does not exhibit a "gap" voltage (step 1125 of FIG. 11). This voltage will cause a current to flow through resistor 62 down to the output line 63 through control 65 and additional superconductive devices 66. This current will be insufficient to switch additional superconductive devices 66, and therefore, since control 65 is of very low inductance, the voltage across control 65 and additional superconductive devices 66 will be very small and will decay very rapidly, such that the current through resistor 62 will predominately go through control 65 and only a negligible amount will pass through resistor 67, and eventually all current will pass through control 65 and additional superconductive devices 66.

The current through control 65 depresses the maximum allowed zero resistance current of superconductive device 51, which then triggers and produces a signal for transfer to the memory circuits (step 1130 of FIG. 11). In an alternative embodiment, other equivalent sensing circuits may be used instead. The pulse sensed by the memory circuit is inverted, amplified, and fed back via terminal 70 (step 1135 of FIG. 11) after an appropriate delay, with sufficient current to exceed the allowed maximum current through superconductive devices 66 and thereby impose a voltage on the output line 43, which will cause current to flow through resistors 62 and 67. However, only superconductive device 42 has a suppressed maximum current, and therefore only line 56 will experience a current back into control 71 via resistor 57; input line 72 will not. As before, control 71 will control superconductive device 75 and the current through superconductive devices 55 will be too small to switch superconductive devices 55 into the voltage state. The input pulse a will be returned as an 'acknowledge' pulse t only to the processor 61, which generated pulse a (step 1140 of FIG. 11), and to no other, provided that the selected cell 41 is the only one energized. This return path is also valid for transfers of data from memory back to the processor 61.

Superconductive Crossbar Switch with Summing Devices

Figure 12:
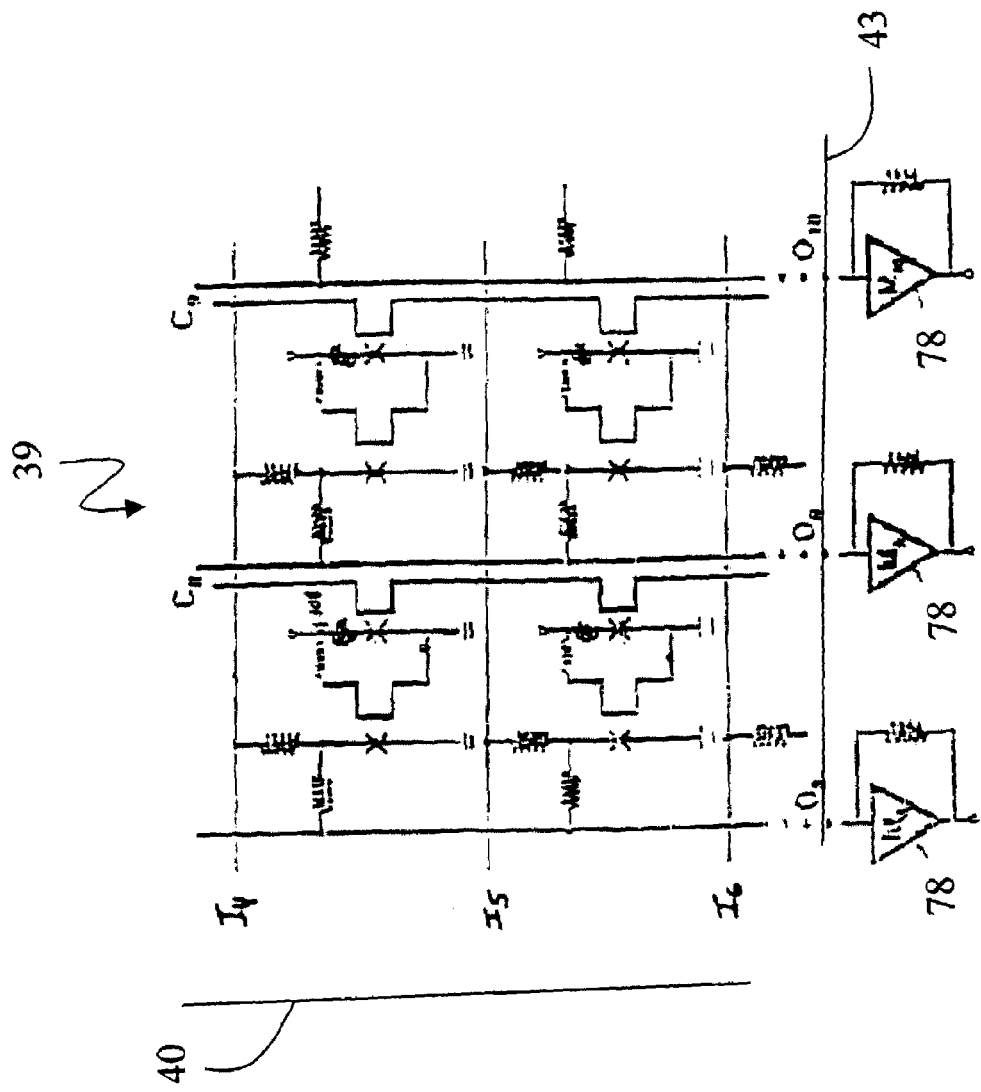
FIG. 12 is a schematic representation of a switch illustrating a plurality of summing devices, and the clamping and crossbar cell memory circuit, in accordance with an embodiment of the present invention.

With reference to FIG. 12, there is shown a crossbar switch 39 having a number of summing devices 78, represented in this embodiment by amplifiers $M_i$, coupled to each output line 43 (e.g., $O_3$, $O_9$, $O_{10}$). The summing amplifier $M_9$ is coupled to output line $0_9$, and so on. The summing devices 78 are operable for summing the output voltages of the cells coupled to the respective output line $O_i$. Summing the input voltages in this manner enables the crossbar switch to accommodate a plurality of inputs and thus renders the matrix extendable in numbers of inputs and outputs. This comes about because the input terminal of the amplifier is summed to zero voltage, thereby producing no crosstalk from the selected processor to the other processors.

Superconductive Crossbar Switch with Additional Junction and Control Line

Figure 13:
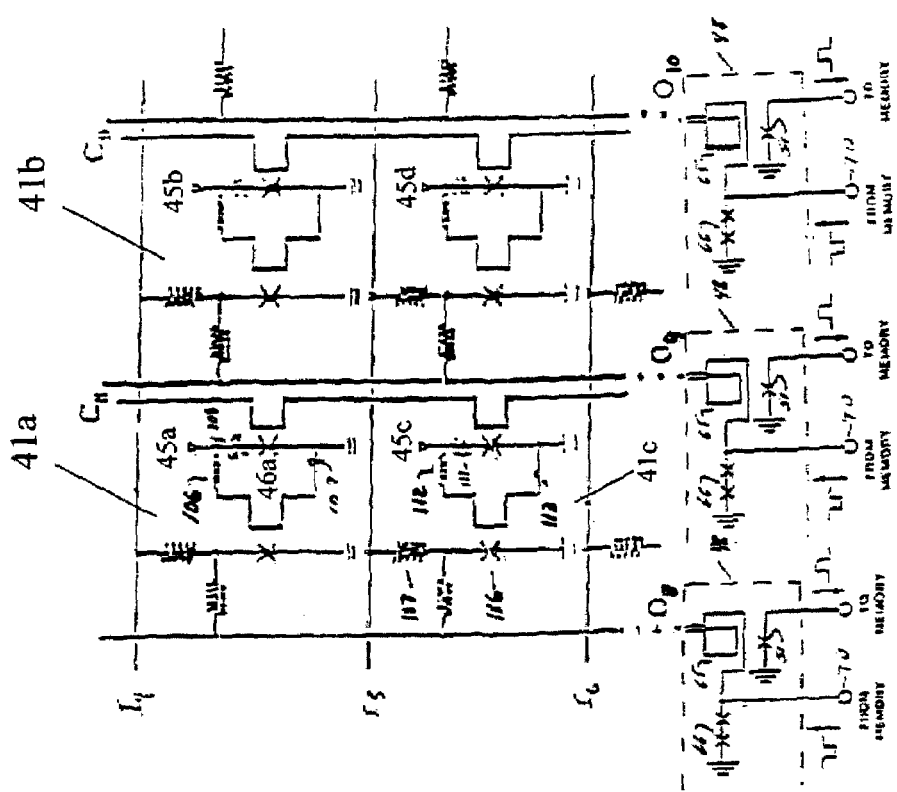
FIG. 13 is a schematic representation of the cell circuits and clamp circuit and their operation in the situation of no contention, in accordance with an embodiment of the present invention.

In order to prevent interference by other processors after an output line has been acquired, an additional junction and control line is provided as is illustrated in FIG. 13. The operation of this device will also be described below with reference to FIGS. 14 and 15. In the crossbar's initial state, current is applied to clamp line $C_8$, thereby depressing the maximum zero resistance current of superconductive device 46a (step 1405 of FIG. 14). When terminal 45a is activated, current will be caused to flow through inductor 106 and control line 107, because the critical current of superconductive device 46a has been reduced to below the imposed decoder current level. This will occur because the clamp current C suppresses the maximum zero resistance current of device 46a.

Figure 14:
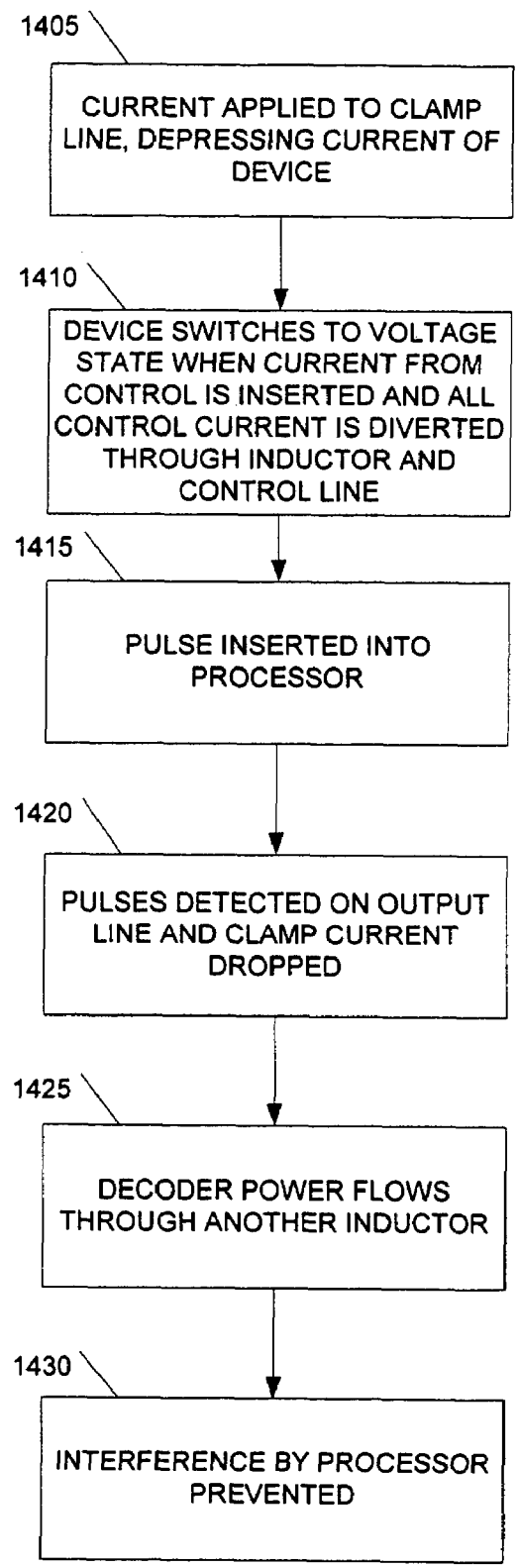
FIG. 14 is a flow diagram illustrating operation of the circuits of FIG. 12, in accordance with an embodiment of the present invention.

With respect to cell 41b, current at terminal 45b will initially flow into inductor 108 because the inductance of inductor 108 is required to be lower than the inductance of inductor 106 (step 1410 of FIG. 14). However, since superconductive device 46a has its maximum zero resistance current reduced because of the signal imposed at $C_8$, superconductive device 46a will switch to the voltage state, and all the current imposed on terminal 45b will be directed through inductor 106 and control line 107.

After the decoder has applied its current at terminal 45b, a flag pulse or set of pulses is inserted into the processor datastream at $I_4$ (step 1415 of FIG. 14). These pulses would normally immediately follow those that select the address. When these flag pulses are detected on the output line $O_8$ for the cell, the CLAMP current on $C_8$ will be dropped (step 1420 of FIG. 14). Now, if decoder power to terminal 45b is removed, the flux stored in inductor 106 will be maintained by a circulating current in the loop comprising inductors 106, 108 and device 46a. This action of dropping the clamp signal succeeds in not only retaining the usage of the output line in cell 41a after the decoder is powered down, but it also prohibits interference by other requesters for the same output line (e.g., in cell 41c).

With reference to cell 45c of FIG. 13, the initial state has the CLAMP line $C_8$ energized, similar to as described above with regard to FIG. 7. Removal of the CLAMP current at $C_8$ causes the critical current of device 46a to no longer be depressed (step 1425 of FIG. 14). Decoder power applied to terminal 45c, will then flow predominately through inductor 111, which is required to have much smaller inductance than the inductance of inductor 112.

The resulting current through inductor 112, and thus control line 113, will be insufficient to depress the critical current of device 116 enough for it to switch when data current flows through resistor 117. This, in effect, prevents interference by the processor (step 1430 of FIG. 14) coupled to line $I_5$, with the output line $O_8$ already in use. By extension, this operation will hold for all late requesters for an output line.

Figure 15:
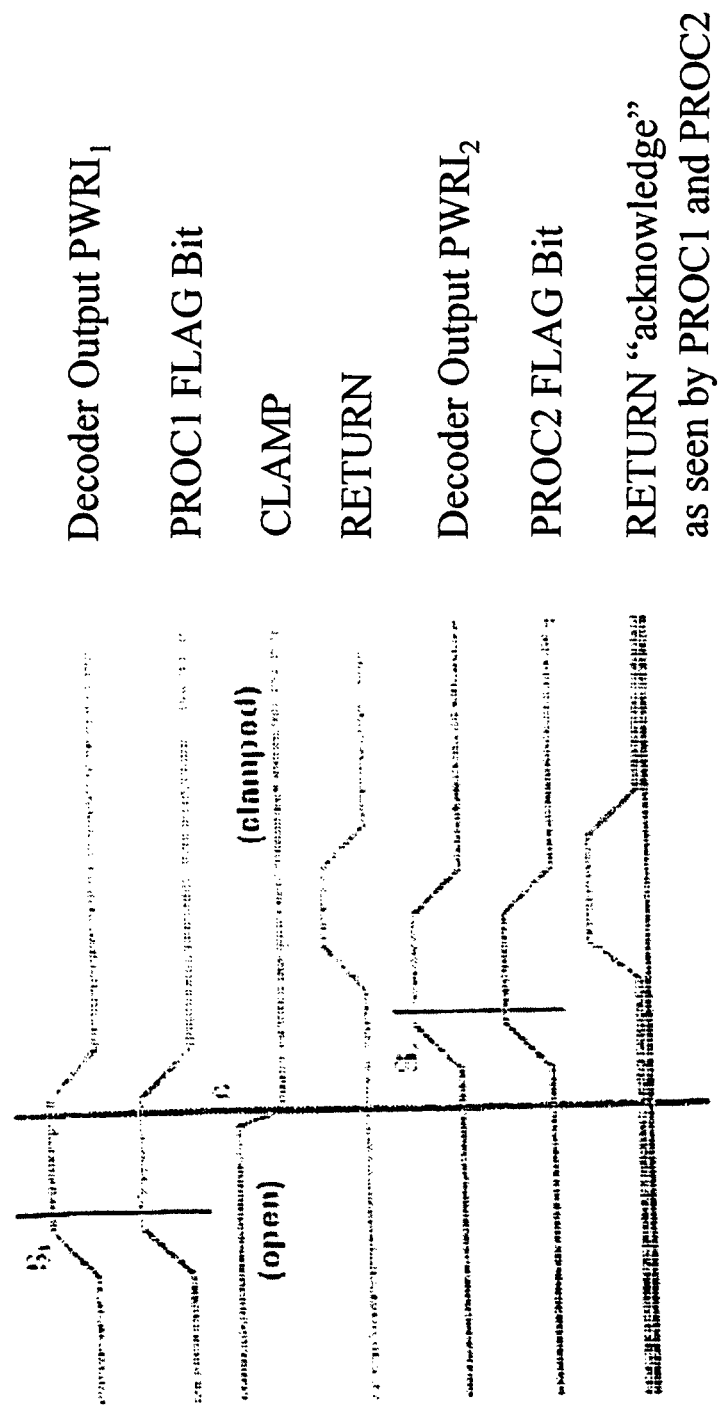
FIG. 15 is a timing diagram illustrating the operation of the circuits of FIG. 13, and a situation of non-simultaneous request (no contention) for a memory line, in accordance with an embodiment of the present invention.

FIG. 15 summarizes the above described behavior. Processor 1 is shown having powered its decoder output, thereby permitting its flag bit to be sent to the SENSE circuits. At a later time, this causes the CLAMP to be dropped at time C from OPEN to CLAMPED at the cell location. Processor 2 thus is unable to insert its flag pulse onto the output line. Finally, the "acknowledge" return pulse is received by only processor 1, as processor 2 connection is not enabled.

Contention Situation

Figure 16:
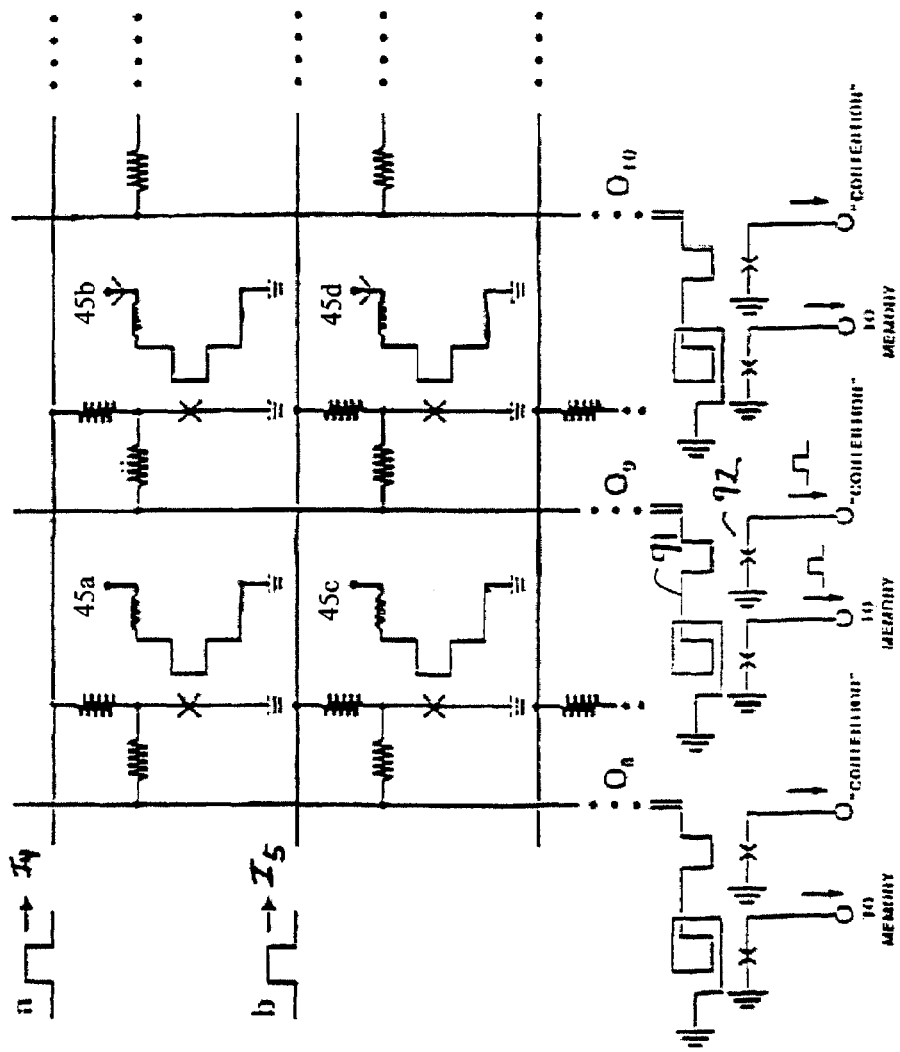
FIG. 16 is a schematic representation of the cell circuits in the situation of two simultaneous requests for the same memory line, in accordance with an embodiment of the present invention.

If two processors request the same memory line at the "same time," a contention situation occurs. For example, in FIG. 16, if the address lines 45b and 45d are "simultaneously" powered, contention will occur between the processors coupled via inputs $I_4$ and $I_5$ for the memory coupled to output line $O_9$. This will cause the memory acquisition to "flag" bits from both the processors coupled to $I_4$ and $I_5$, and thus to drive the output line at the same time. This will produce two units of current in the control line 91, which triggers the "contention" sensor 92. Detection of this event will cause the support electronics to ignore the SENSE signal and to keep the CLAMP line on current HIGH. This function may also be provided by cryogenic circuitry. No return "acknowledge" pulse is sent, thereby, by its absence, informing the requesting sources of their failure to acquire the requested output line.

Situation Where Two Processors Have Requested Memory

Figure 17:
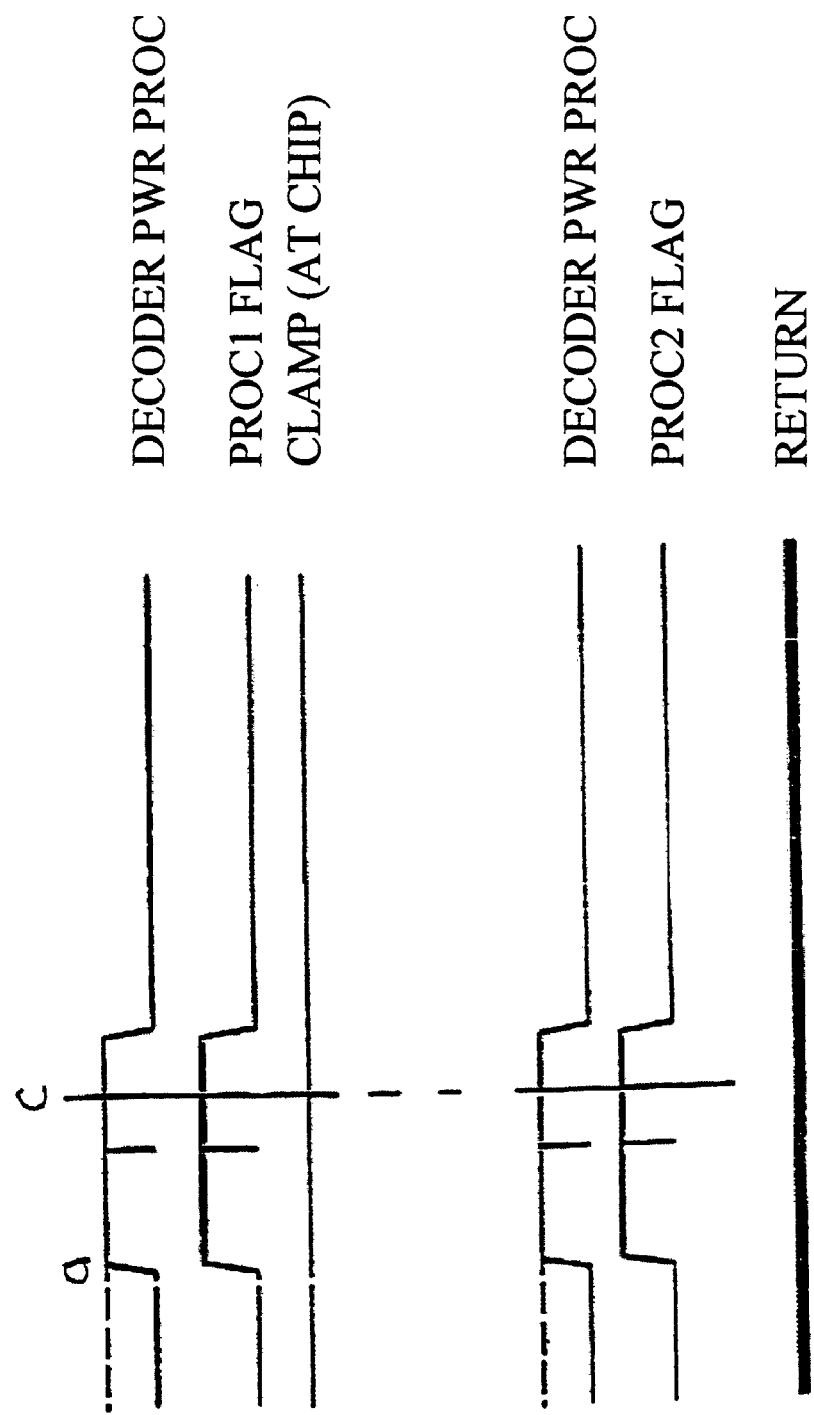
FIG. 17 is a timing diagram illustrating the operation of two processors contending for the same output line, in accordance with an embodiment of the present invention.

FIG. 17 depicts the situation wherein processors 1 and 2 have requested the memory at the same time. In that event, the clamp line is not dropped at C, the crossbar cells on that memory line stay available, and no "acknowledge" pulse is returned to the requesters. This silence advises them to retry. If processor 2 requests the memory line at a time between a and C, the electronics can still keep CLAMP high, withhold "acknowledge," and thereby maintain availability to other requesters. This may be done at cryogenic temperature or at room temperature.

Example of 128×128 Switch

Figure 18:
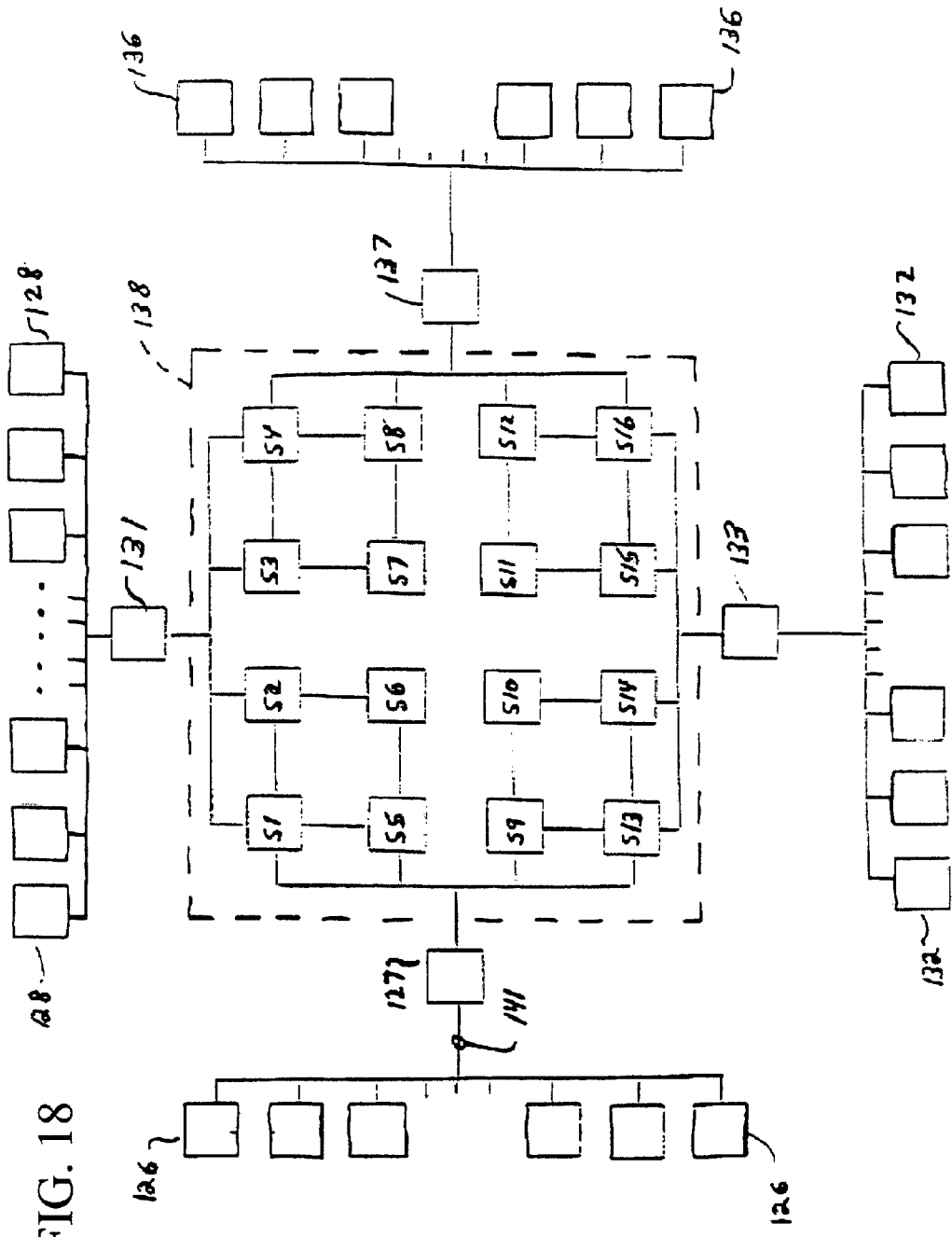
FIG. 18 illustrates a representative physical layout of a 128×128 crossbar switch, in accordance with an embodiment of the present invention.

FIG. 18 shows an example of a 128 input×128 output crossbar switch embodying the features of the present invention. In this example, 64 processors 126-126 are coupled to a processor glue chip 127 and 64 memories 128-128 are each coupled to a memory glue chip 131. There are 64 more processors 136-136 coupled to a second processor glue chip 137 and an additional 64 memories 132-132 coupled to a second memory glue chip 133. Connected between these glue chips is a crossbar switch 138 essentially comprising a plurality of interconnecting matrices of cells S1-S16, each of which is a 32×32 crossbar matrix. Each of the 64 processors 126-126 is coupled via an input data line 141 to processor glue chip 127, to which each of the 64 processors 126-126 transmits serial bit data. Processor glue chip 127 outputs and receives that data into chips S1, S2, S5, S6 for transactions to and from memories 128-128 by the 64 processors 126-126. It also outputs and receives the data into chips S9, S10, S13, S14 for transactions to and from memories 132-132 by the same 64 processors 126-126. Likewise, chips S3, S4, S7, S8 connect processors 136-136 to memories 128-128 while chips S11, S12, S15, S16 connect processors 136-136 to memories 132-132.

The selection of a memory line by a given processor is accomplished by including a destination memory address in that processor's submitted data word and clocking it via the appropriate input clock line on the proper crossbar chip (i.e., the required input processor and sought-for-output memory line). The destination address may also be introduced by an external controller and may also be decoded by an external decoder.

The return data from the interrogated memory line is fed into the corresponding memory glue chip as DRIVE, returned in parallel to the crossbar bank and is transferred to only the activated and locked processor line. From there, it continues to the corresponding processor glue chip and on to the originating processor. Clamping is accomplished by controlling a separate line (not shown), which disables access of all the unselected processors to the activated memory line. Contention is separately detected on the memory glue chip.

Switch Chip

Figure 19:
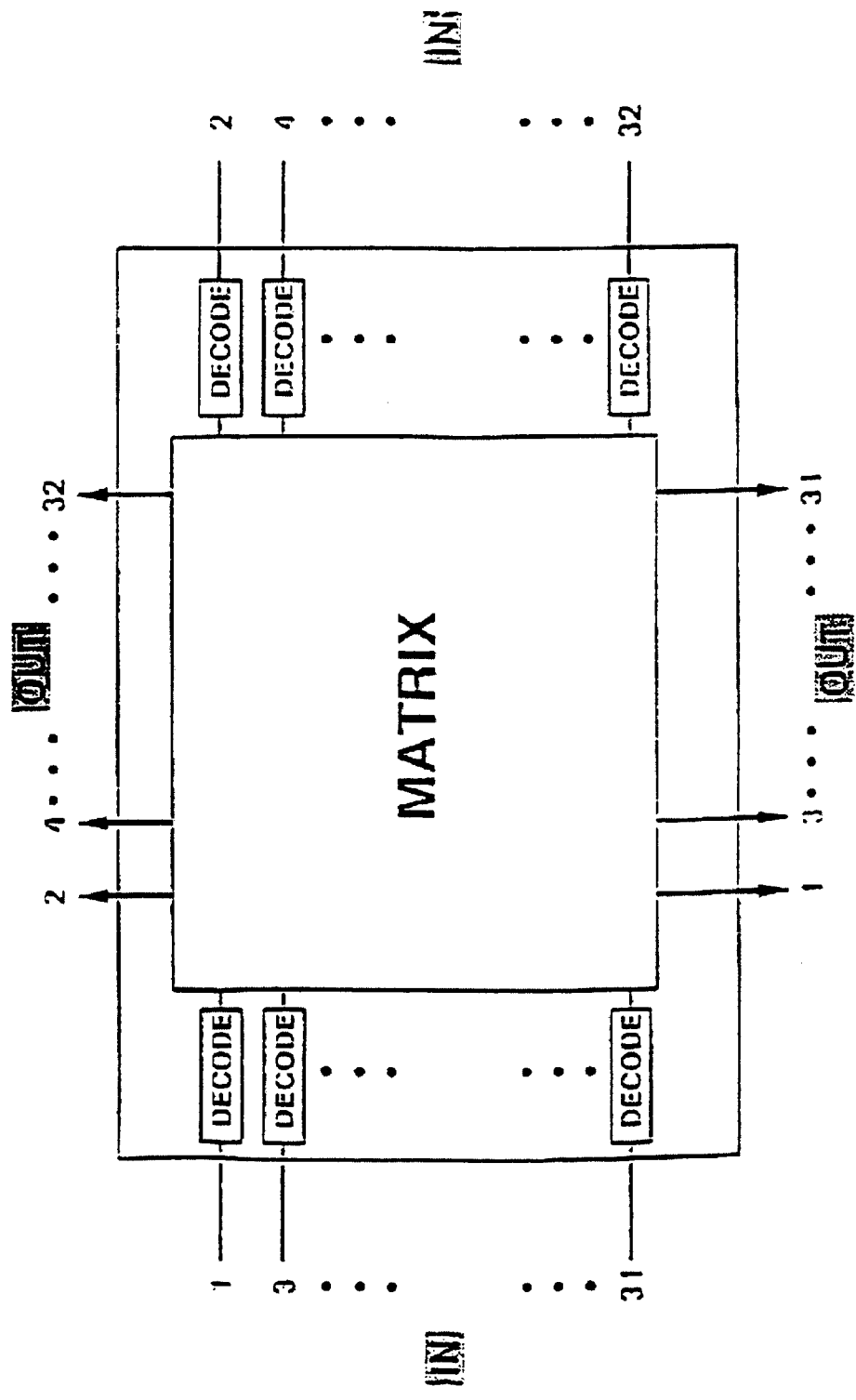
FIG. 19 illustrates a representation of a crossbar switch chip, including separate decoders and the switching matrix, in accordance with an embodiment of the present invention.

FIG. 19 illustrates an embodiment of a switch chip that interconnects 32 input lines to 32 output lines via the previously described matrix of cells. In this example, each processor is assigned and coupled to its own decoder, which decodes the destination address that was requested by that processor and activates the address line of the proper cell in the matrix, as previously described. Such a chip may be replicated to populate the 128×128 matrix described in FIG. 17.

Example embodiments of the present invention have been described in accordance with the above advantages. It will be appreciated that these examples are merely illustrative of the invention. Many variations and modifications will be apparent to those skilled in the art.

What is claimed is:

1. A superconducting crossbar switch, comprising:
 a plurality of input lines;
 a matrix of a plurality of cells, each of the plurality of cells being coupled to one of the plurality of input lines, wherein each of the plurality of cells includes:
  at least one first circuit portion containing at least one first superconducting switch; and
  at least one second circuit portion, wherein at least one first signal via the at least one second circuit portion triggers the at least one first superconducting switch;
 a plurality of output lines, each of the plurality of output lines coupled to at least one of the plurality of cells;
 at least one first processor glue chip and at least one second processor glue chip coupled to the matrix of the plurality of cells;
 at least one first memory glue chip and at least one second memory glue chip coupled to the matrix of the plurality of cells;
 at least one first plurality of processors coupled to the at least one first glue chip via at least one first input data line;
 at least one second plurality of processors coupled to the at least one second glue chip;
 at least one first plurality of memory devices coupled to the at least one first memory glue chip; and
 at least one second plurality of memory devices coupled to the at least one second memory glue chip.

* * * * *